United States Patent [19]

Mattera et al.

[11] Patent Number: 4,776,971

[45] Date of Patent: Oct. 11, 1988

[54] GALLIUM ARSENIDE SINGLE CRYSTALS WITH LOW DISLOCATION DENSITY AND HIGH PURITY

[75] Inventors: Adriano Mattera, Novara; Roberto Fornari, Parma; Renato Magnanini, Reggio Emilia; Carlo Paorici, Parma; Lucio Zanotti, Parma; Giovanni Zuccalli, Parma, all of Italy

[73] Assignees: Montedison S.p.A., Milan; Consiglio Nazionale Delle Ricerche, Rome, both of Italy

[21] Appl. No.: 867,514

[22] Filed: May 28, 1986

[30] Foreign Application Priority Data

May 29, 1985 [IT] Italy ................................ 20936 A/85

[51] Int. Cl.[4] ........................ C30B 15/00; C30B 15/04; C30B 15/20

[52] U.S. Cl. ........................ 252/62.3 GA; 156/620.2; 156/607; 156/605; 156/DIG. 70

[58] Field of Search ............... 252/62.3 GA; 156/601, 156/605, 606, 607, 617 SP, 618, DIG. 70, DIG. 81, 620.2

[56] References Cited

U.S. PATENT DOCUMENTS

3,819,421  6/1974  Merkel et al. .................... 148/1.6
4,058,429 11/1977  Duncan et al. .................... 156/601
4,478,675 10/1984  Akai ............................... 156/605
4,645,560  2/1987  Matsumoto et al. ........... 156/617 SP

OTHER PUBLICATIONS

Shimada et al., "Growth and Resistivity Characteristics of Undoped Semi-Insulating GaAs Crystals with Low Dislocation Density", Jap. J. Appl. Phys. 23(7), L441-4 1984.
Weiner et al., "Liquid Encapsulated Czochralski Growth of GaAs", J. Electrochem. Soc.: Solid State Sci., Feb. 1971 pp. 301-306.
Au Coin et al., "Liquid Encapsulated Compounding and Czochralski Growth of Semi-Insulating Gallium Arsenide", Solid State Tech., Jan. 1979, pp. 59-62, 67.
Antypas, G., "LEC Czochralski Growth of GaAs...", Proceedings of the Fifth Cornell Electrical Engineering Conference, 1975, pp. 119-126.

Primary Examiner—John Doll
Assistant Examiner—R. Bruce Breneman
Attorney, Agent, or Firm—Morgan & Finnegan

[57] ABSTRACT

Undoped GaAs single crystals with low dislocation density, low impurity content, 0.20-1 Kg in weight and constant diameter of 1"-2" (inches), said single crystals being obtained with LEC technology at low or high pressure with synthesis of the polycrystal in situ and subsequent growth of the single crystal.

9 Claims, 2 Drawing Sheets

GALLIUM ARSENIDE SINGLE CRYSTALS WITH LOW DISLOCATION DENSITY AND HIGH PURITY

BACKGROUND OF INVENTION

The present invention relates to GaAs single crystals of high structural perfection and of high purity.

More particularly, the invention relates to GaAs single crystals with low dislocation density and low impurity content through contamination, diameter ≧1" with minimum variations in diameter of ±2 mm, 0.2 to 1 Kg weight.

It is known that the GaAs is a semiconductor used as substrate in devices, which find application in:
  traditional telecommunication systems (radio and telephone links, T.V. etc.),
  communication systems on optic fiber (discrete and integrated components),
  distribution systems for television programs via satellite,
  radar systems for various uses,
  systems for switching high-speed numeric signals.

Among the most well known GaAs devices, there are those optoelectric devices (photodetectors, senders, laser, light omitting diodes, etc.), and microwave devices (e.g. Gunn diodes, IMPATT diodes, Schottky diodes, etc.).

Moreover, GaAs is used in the integrated circuits: analogic, digital, monolithic integrated circuits of medium or large scale integration.

It is known from technical and patent literature, that the most used processes for the growth of GaAs single crystals on industrial scale are substantially two:
  Czochralski liquid encapsulation technique (LEC) and
  Bridgman horizontal oven technique (HBG).

This latter technique has the advantage of giving low dislocation density crystals, but presents the drawback of giving a high silicon contamination, derived from the quartz tube used in the growth. Such contamination is intrinsic to this technology. Moreover, this technique is not very flexible, because it only allows one to obtain oriented crystals <111> with good characteristics and cylindrical shape but not with a circular section. This is a significant drawback because most of the electronic device use <100> oriented single crystals with cylindrical shape and circular section. Moreover the presence of high concentration of silicon does not allow the fabrication of devices which use semi-insulating GaAs, such as, for instance, microwave devices.

The Bridgman technique renders the scale passage to single crytals with high diameter and weight, problematic due to intrinsic difficulties of the technique itself.

Generally, in order to produce crystals with high diameter, usually ≧1" and varying weight, also exceeding 1 Kg, the LEC process is used. This method allows one to obtain crystals having the desired weight and dimensions (diameter) and circular sectioncylindrical shape, which obviously require growth times varying according to the weight. In this way, the presence of impurities is avoided and relatively reduced cycle times are used. However, the LEC technique, notwithstanding the various weight and diameter control methods usually used, presents the drawback of giving high dislocation density crystals, about $10^4$–$10^5$ Cm$^{-2}$, and a high lack of structural and/or composition homogeneity both axial and radial, when the crystals have a diameter ≧1".

Moreover, in the LEC technique, polycrystals obtained with the Bridgman process are often used for the growth, giving single crystals with a high silicon impurity concentration. To improve the purity of the single crystal, the same Czochralski (CZ) oven for the synthesis in situ of the polycrystal is used, starting from the elements, Ga and As, and for the following successive growth of the single crystal.

However, even single crystals which are grown with this expedient have a dislocation concentration which is too high, a lack of structural homogeneity due to the process of microdefects, microprecipitates, etc., and moreover, frequently present a lack of uniformity in diameter, generally ±3–5 mm for diameter ≧1". Moreover, these characteristics tend to become worse with the increase of weight. This lack of diameter homogeneity provokes remarkable loss of utilizable material in processing, in that this requires constant diameter slices.

Moreover, said lack of diameter homogeneity has an influence in the formation of reticular defects, particularly dislocations.

The high number of dislocations and the lack of structural homogeneity have negative effects in the processing of the wafers (slices) because of diffusive phenomena, and consequently have a negative influence on the characteristics of the devices, which are reproducibility, average life, noise, etc.

For instance, in the epitaxial growth processes, the use of wafers (slices) containing a high number of defects provokes migration of the defects and of the impurities from the substrate to the epitaxial layer, above all in the vicinity of the junction.

To diminish the dislocation density, the crystals are generally doped with dopants, such as for instance, boron, silicon, selenium, sulphur, tellurium, in quantities comprised between $10^{16}$–$5 \times 10^{17}$ atoms/cm$^3$.

In particular, it is observed that with some of these dopants the dislocations tend to disappear when using a higher concentration of dopant generally comprised between $5 \times 10^{17}$–$10^{19}$ atoms/cm$^3$.

Methods normally used to diminish the dislocations with dopants are described in the published U.K. patent application 2.108.404 A.

These systems for reducing the dislocations with the use of dopants are not suitable for preparing single crystals to be used as intrinsic semiinsulators, in that the presence of the dopants renders the single crystals semiconductors.

The resistivity $\rho$ in fact, lowers from the values of about $10^7 \Omega$ cm. to values $<10\Omega$ cm.

The presence, for instance, of $10^{16}$–$10^{19}$ atoms/cm$^3$ of dopant, renders the single crystals unsuitable for applications as intrinsic semiinsulators.

Only for certain applications, such as for instance, for solar cells, dopant quantities of $10^{17}$–$5 \times 10^{18}$ atoms/cm$^3$ are required.

Therefore, it was desirable to obtain GaAs single crystals with such a low dislocation density as to make them suitable for applications as intrinsic semiinsulators, for instance, for integrated logic, FET or GUNN diodes.

Moreover, a low number of dislocations makes the single crystals preferable in that it allows for high quality devices with good signal reproducibility, low noise, high average life.

However, it also desirable to have available, single crystals having a low number of dislocations also for certain applications wherein doped single crystals are required.

In fact, if the number of dislocations is high, it is necessary to use a high quantity of dopant, between $5 \times 10^{17}$ and $10^{19}$, to reduce it.

This presents notable drawbacks in that microprecipitates can be generated which give devices with electric characteristics of poor quality, for instance, the cutoff frequency in the Gunn diodes is lowered, as the average life of laser, and the signal propagation velocities in electronic systems are lowered, such for instance, in telecommunications, in computers, in radar systems, etc.

OBJECTS OF THE INVENTION

It is an object of this invention to provide GaAs single crystals having the desired attributes of those produced by prior art techniques but which are free of many of the drawbacks of the crystals produced in accordance with said prior art techniques.

A further object of this invention is to provide GaAs single crystals, obtained with the LEC technique, having heavy weights, circular section cylindrical shape, low impurity content, any orientation, constant diameters so as to have allow number of wastes in the processing, a low number of dislocations without using dopants, and which are free of many of the drawbacks of the single crystals obtained with prior art techniques.

A still further object of this invention is to provide GaAs single crystals having wider rise applications that is possible with GaAs single crystals produced by prior art techniques.

Another object of this invention is to provide GaAs single crystals with low dislocation content both for non-doped crystals and for crystals with low dopant content, which, besides having a low impurity content, are 1″ in diameter and have a weight even up to 1 Kg.

A still further object is to provide GaAs single crystals having a diameter from 1″ to 2″, weight from 200 g to 1 Kg., impurity content $\leq 5 \times 10^{15}$ atoms/cm$^3$ and dislocation density comprised between $5 \times 10^2$ and $8 \times 10^3$ cm$^{-2}$ without resorting to the use of dopants, with diameter constancy of $\pm 2$ mm, having circular section cylindrical shape and an orientation preset as desired.

Preferably, the GaAs single crystals of this invention have a diameter between 1 and 2 inches, orientation according to the direction $<111>$, $<100>$ or $<110>$. More particularly, the most preferred orientations are according to the directions $<111>$ and $<100>$. The EPD (etch pitch density) dislocations in the case of single crystals with $<111>$ orientation are comprised between $5 \times 10^2$ and $10^3$ cm$^{-2}$ both axially and radially; in the case of $<100>$ orientation, EPD are between $10^3$ and $8 \times 10^3$ cm$^{-2}$.

A further object of the present invention is that the single crystals of the invention can be doped with $10^{17}$–$10^{18}$ atoms/cm$^3$ of dopant, to obtain semiconductors for the various above mentioned practical applications, without showing the presence of microprecipitates.

In this case, the dislocations lower to various $<10^2$ and can even completely disappear.

As dopants, those commonly used in the art are used. For instance, silicon, sulphur, tellurium, selenium, boron, chrome and zinc can be cited.

The absence of microprecipitates was observed under an electronic microscope with the transmission electron microscopy TEM technique.

Moreover, it was found that the oriented updoped single crystals $<111>$ undoped, have seminsulating chracteristics with resistivity $\rho$ comprised between $10^6$ and $10^7$ $\omega$cm., and with mobility $\mu$ also comprised between 2000 and 3500 cm$^2$/(volt.sec) for undoped n-type GaAs.

Instead, in the case of undoped p-type GaAs, it was found that the mobility lowers remarkably.

BRIEF DESCRIPTION OF THE DRAWINGS

FIG. 2 shows the programme of the voltage ramp programmer during (a) melting, (b) growth, and (c) cooling.

GENERAL DESCRIPTION OF THE INVENTION

Figure 1:
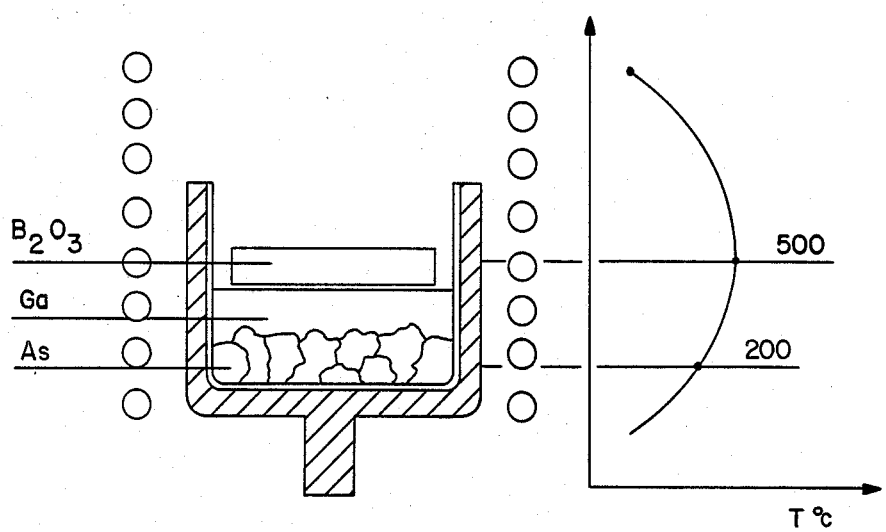
FIGS. 1-1 and 1-2 show the position of the growth station inside the radio-frequency coil with relevant temperature gradients.

It has been found that the objects of this invention may be realized by the utilization of a process which uses a modified LEC technique in one cycle starting from the elements with synthesis of the polycrystal in situ and subsequent growth of the single crystal, as described hereinafter. Unexpectedly, it was found that it was possible to obtain the GaAs single crystals of the invention by use of suitably studied elementary steps in the synthesis and growth phases, as described hereinafter, and by the use of a very precise automation system for controlling and programming the temperature in the growth chamber, obtained by means of an interface between the voltage ramp programmer and the temperature regulator.

The interface and its functions on the output voltages of a commercial programmer, are described in detail in application (Italian patent application 20915A/85).

Preferably, also in the present invention the programmer, the CZ oven and the regulator mentioned in the said application Italian patent 20915A/85, are used, which is incorporated in the present application by reference.

In particular, the growth equipment used is a radio frequency or resistance ADL mod. HPCZ oven for crystals up to 3 Kg. Heralux quartz crucibles having a diameter=5–10 cm and height=6–12 cm., high purity ringsdorff graphite susceptors (impurity $<150$ ppm), As (purity 6N) produced by MCP, Ga (purity 7N) manufactured by Alusuisse, B$_2$O$_3$ Puratronic produced by JMC, were used. The boric oxide underwent a vacuum ($10^{-4}$ Torr) purification cycle in an oven at 1000° C. for 3–4 hours and presented residual impurities $<1$ ppm.

High purity N$_2$ was used (special UPP having a O$_2$ content $<1$ ppm), as inert gas in the various phases of the cycle, even though it is possible to use other superpure inert gases such as argon.

High purity BN crucibles can also be used so as to avoid any contamination of the GaAs single or polycrystals by silicon and by oxygen deriving from the quartz crucibles.

The process for the preparation of the single crystals of the invention includes the following steps:

(a) preparation of the GaAs polycrystal in situ which includes reacting the elements Ga and As, under conditions of inert gas high pressures, comprised between 50 and 70 atm., operating in the presence of a quantity of B$_2$O$_3$ sufficient to produce a molten layer 0.7 to 2 cm.

thick; using a commercial programmer of voltage ramps on an output voltage channel having minimum voltage increases of about 10 mV, said voltage being increased during this step in such a way as to limit the evaporation of the As to values <1% by weight, with respect to the initial quantity of As used, during the entire step so that the polycrystal stoichiometry is comprised between the following values:

$$0.49 < As/Ga + As < 0.51;$$

(b) growth of the single crystal using the polycrystal obtained in step (a) which includes the melting of the polycrystal at temperatures in the range of 1250° C. to 1300° C., using inert gas pressures of 60–70 atm in the growth chamber; lowering of the temperature until the contact between seed and molten material is formed; growth phase at low inert gas pressures in the range of 2 to 6 atm. or at high pressures in the range of 25 to 50 atm., for the formation of the neck with a diameter in the range of 2 to 3 mm and a length in the range of 5 to 14 mm, formation of the shoulder in a time in the range of 1 to 2 hours, formation of the cylindric section single crystal with constant diameter in a time in the range of 3 to 5 hours; said step (b) being carried out with a very strict control of the temperature obtained automatically by means of a microprocessor, inserted between the oven and the programmer, which allows for obtaining output voltages from channel 2 of said programmer with increases $\leq 1$ mV;

(c) cooling of the single crystal, including a slow and controlled decreasing stage at 30°–60° C./hour until the temperature of 900°–1000° C. is reached, and a faster cooling stage, until room temperature, at 80°–120° C./hour.

For illustration purposes, the synthesis steps of the polycrystal and those of the subsequent growth of the single crystal, are described separately and in more detail hereinbelow.

Synthesis Of The Polycrystal

The synthesis of the polycrystal is carried out in the same equipment used for the growth, starting from the elements. The method used, uses a series of suitably studies elementary steps which include the automatic control of the voltage variations, in the order of 10 mV, using the normal commercial voltage ramp programmers. For instance, the Honeywell programmer DCP 770 can be used for this purpose.

In this way, it is possible to eliminate all the manual operations for voltage variation which given rise to uncontrolled variations of the temperature in the growth chamber with consequent poor reproducibility of results.

The automatic voltage ramp programmer is connected to an oven temperature regulator by means of a microprocessor as described in Italian patent application 20915A185.

Any Czochralski CZ oven can be used as growth oven, in particular, the one hereinbefore described. In this case, the temperature regulator is a CAT series 80.

The automatic variations of voltage cause controlled variations of temperature in the oven with a sensitivity of 1° C. In this way, it was possible to grow GaAs polycrystals with a defined stoichiometry comprised in the range:

$$0.49 < As/Ga + As < 0.51; \qquad (1)$$

In fact, it is known that polycrystals having even a minimum deviation from the stoichiometry of range (1), give rise to single crystals wherein the concentration and the nature of the reticular defects, such as vacancies, antisites, precipitates, inclusions, are not controllable. In this way, using this polycrystal as precursor, it is impossible to obtain single crystal having reproducible electric characteristics, such as trap concentrations, mobility type of conductivity and thermic stability, and reproducible structural characteristics, like for instance dislocation density.

In order to obtain polycrystals having a stoichiometry comprised between the range (I), the temperature variations are an essential parameter, even if it is necessary to take into consideration the other parameters hereinbelow mentioned.

Arsenic first and then Gallium are loaded, in approximately stoichiometric ratio (molar ratio about 1:1) in the crucible, and then $B_2O_3$ is loaded, in such a way that when molten, it gives a thickness from 0.7 to 2 cm.

Then, after having input an inert gas pressure of a few atmospheres, for instance very pure nitrogen or argon, into the growth chamber, the crucible is heated so as to melt $B_2O_3$, and $B_2O_3$ is kept at the melting point or higher, while arsenic is kept at a temperature whereat it is still at the solid state, about 100° C. to 300° C.

Then the pressure of the inert gas is further increased to pressures in the range of 50 to 70 atm., or higher, and the temperature of the gallium and arsenic is simultaneously gradually increased up to the reaction temperature between Ga and As so as to given GaAs polycrystals. Such reaction starts at 820° C. and this or even a higher temperature for instance of 820° C. to 880° C. is kept for the necessary time, which depends on the absolute weight quantity of Ga and As under reaction.

For instance, to prepare a 100 g polycrystal, the reaction is carried out for a time composed between 1 and 2 hours.

Generally, it can be useful to remelt the obtained polycrystal and re-crystallize it to avoid lack of structural homogeneity.

Operating as described, polycrystals having stoichiometry which is included in the range of equation (1), can be obtained.

The thus obtained polycrystals shows an impurity level $\leq 5 \times 10^{15}$ atoms/cm$^3$, and the reaction yield is very high, even capable of reaching the theoric value.

An expert in the field can easily determine, on the basis of the indicated parameter values, the utilizable conditions even for CZ ovens of different type.

The thus obtained polycrystal can be cooled with the cooling cycle indicated hereinafter for the single crystal, to determine its stoichiometry, impurities, electric and structural characteristics.

However, generally it is preferable to determine said characteristics indirectly, namely, by measuring said characteristics on the single crystal grown using the thus prepared polycrystal as precursor, and proceeding directly in a single cycle with the system as such for the formation of the single crystal.

Growth of the single crystal

The innovation in the growth of the single crystal is that of using the polycrystal, prepared as hereinbefore described, as precursor, without cooling, said polycrystal having a high purity and a high structural and stoichiometric homogeneity, included in the range of equation (1), and applying a series of suitably studied elementary steps, as indicated hereinbelow, and automized with a voltage ramp programmer (Honeywell DCP 7700) interfaced with a suitable electronic device to a temperature regulator (CAT series 80) which permits to change the voltage of values $\leq 1$ mV with temperature variations of 0.1° C. or below.

The evaporation of the arsenic, the generation of reticular defects, the capturing of impurities in the growth and cooling step of the crystal are thus minimized, and the diameter is kept constant ($\pm 2$ mm).

The interface microprocessor and its way of working are described in the synthesis of the polycrystal hereinbefore.

The steps carried out for in the growth of the single crystal following the synthesis of the polycrystal, namely continuing with the operations from the point at which the system was after obtaining the polycrystal, are essentially the following:

melting of the polycrystal at a temperature higher than that of melting generally in range of 1250° C. to 1300° C. and with inert gas pressures in the growth chamber of 60–70 atm.

lowering of the melt temperature to that of growth, which is experimentally determined by dipping the single crystal seed in the melt and noting whether the contact between the seed and the melt is maintained; it this does not happen then the temperature is slightly lowered. The contact can be determined by the electric instruments with which the CZ is equipped, for instance, observing whether there is a flow of current in an amperometer when the seed closes an electric circuit with the melt. Generally, the growth temperature is in the range of 1230° C. to 1245° C.

At this stage, growth can occur at low inert gas pressure, generally comprised between 2 and 6 atm., or at high pressures, for instance between 25 and 50 atm. However, it is preferable to work at low pressure.

At this stage of the cycle, the growth phase, strictly speaking, starts, at the previously determined growth temperature, and the system is stablilized at this temperature.

the seed "neck" formation phase starts, which neck is of about 2–3 mm in diameter and 5–14 mm long; to minimize the propagation of the dislocations from the seek to the single crystal.

then the formation of the "shoulder" of the crystal starts, in fairly long times so as to form a sufficiently flat shoulder, namely with the smallest possible angle between the seed and the face of the shoulder.

Generally, this time varies between 1 and 2 hours.

The formation of the circular section cylindrical shape single crystal with constant diameter, starts. The time depends on the charge of polycrystals used. Generally, the time varies form 3 to 5 hours for polycrystal from 300 to 500 g.

In this stage, the use of the microprocessor, as hereinbefore described, is essential for controlling and varying the melt temperature, so that this temperature is varied in the most controlled manner possible in order to avoid the creation of reticular defects. Variations of 1 mV, or less, corresponding to temperature variations of melt of about 0.1° C., or less, have shown to be the most suitable for obtaining Ga As single crystals with the dislocation values of the invention. These small variations of voltage increment in this stage, permit to control the fluid mechanics of the melt, namely, the geometric evolution of the melt - crystal interface, in such a way as to minimize the defect formation.

The pulling speeds used in the growth phase vary between 0.5 and 2 cm/hour, the shaft anti-clockwise rotation speed is comprised between 1.5 and 6 rpm, and the crucible clockwise rotation speed is comprised between 2 and rpm.

With all these parameters, it is possible for any expert in the field to control and find the best growth conditions of the single crystal.

Cooling

When the single crystal preparation cycle is terminated, the cooling phase inside the chamber is carried out in a slow and controlled manner, generally decreasing the temperature by 30°–60° C./hour until arriving at 900°–1000° C. inside the chamber itself.

Then cooling is carried out a higher speed, about 80°–120° C./hour until reaching room temperature.

The seed which is used, has a predetermined orientation and is obtained from a previously prepared single crystal, according to known methodologies.

At the end of the single crystal growth, the single crystal stoichiometry can be checked by means of the following equation (2):

Ga weight + As weight + seed weight = single crystal weight + GaAs residual polycrystal weight + evaporated As weight. (2)

All the weights indicated in equation (2) being known, except the weight of the evaporated arsenic, this value can be determined by equation (2).

For all the growths of the invention, the loss due to As evaporation is $\leq 1\%$ in weight of the loaded arsenic.

Such losses give rise to single crystals having a stoichiometry included in the range (1). Consequently, even the solid or molten polycrystal satisfies the equation (1).

Figures 1, 2:
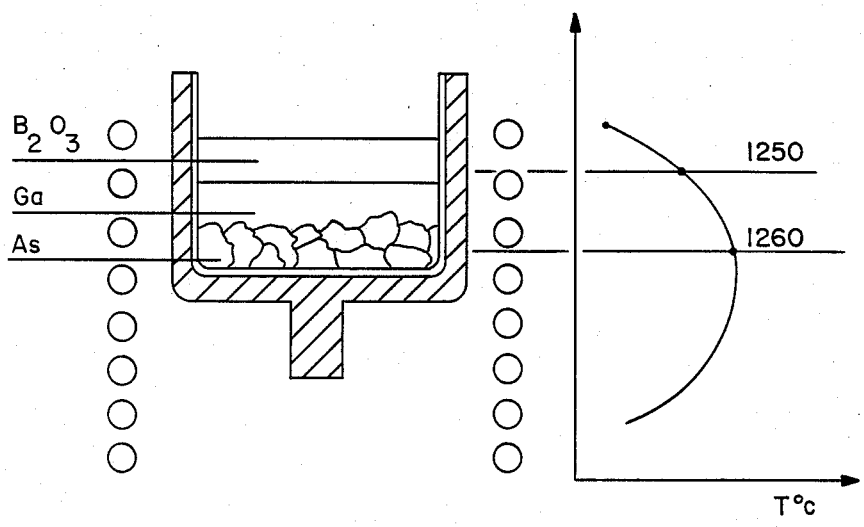
Figure 2:
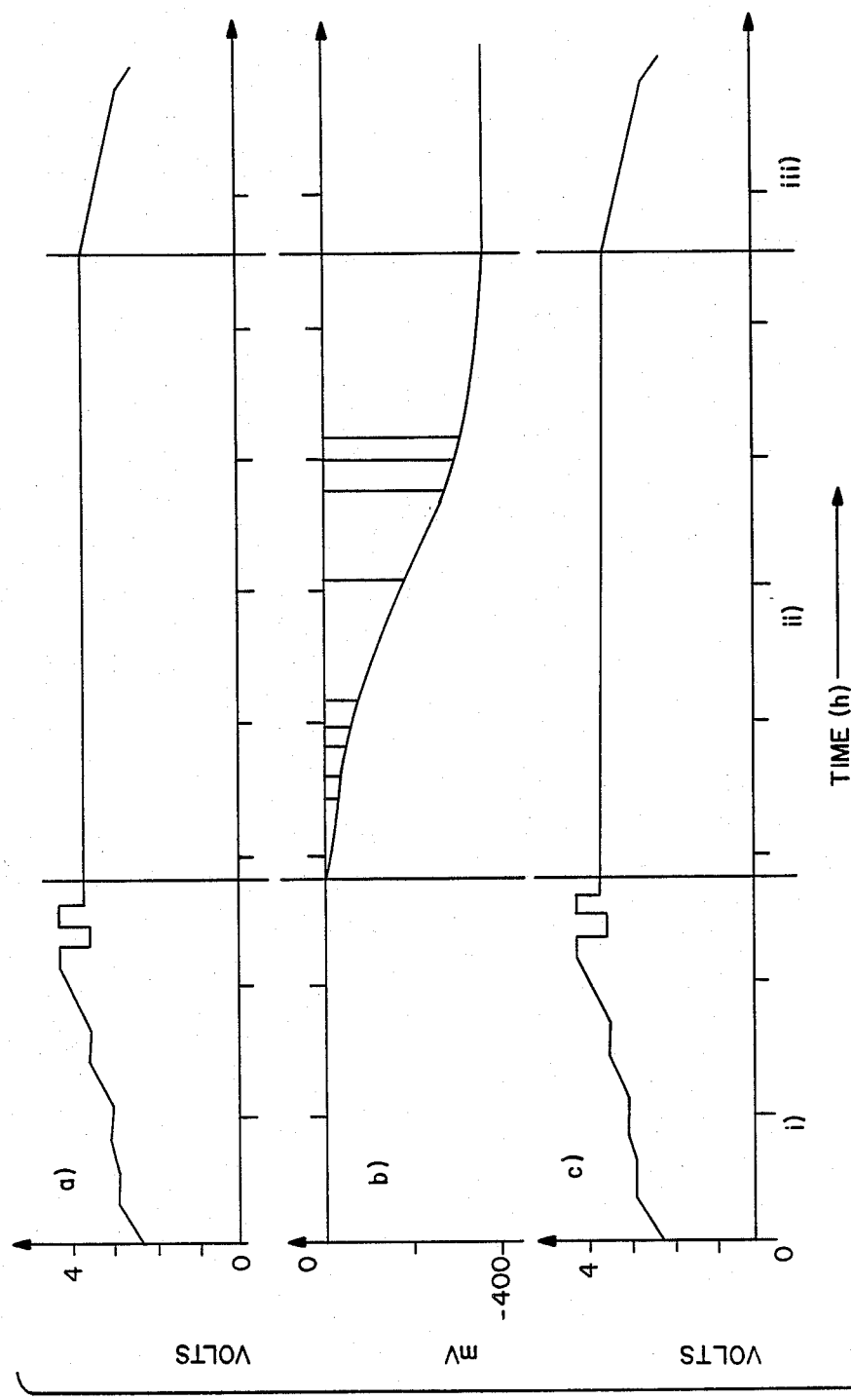

In FIG. 2, the various voltages which can be used during the entire process using the automated system consisting in the microprocessor and the programmer, are shown. The minimum and maximum voltage values and the relevant increments of the various channels are shown in Example 1.

(i) Synthesis of the GaAs. High voltage increments are required, therefore adjustment occurs in steps exceeding 10 mV. Programming is carried our with channel CH3 in the range 1–5 Volts, while channel CH2 is kept constant, at zero value, FIG. 2(a).

(ii) Growth of the crystal. Having supplied the oven with the power necessary to melt the entire GaAs charge, the output voltage of channel CH3 is kept constant. The voltage decrements (less than or equal to 1 mV), necessary for obtaining the crystal in a regular, cylindrical shape, are programmed by channel CH2 which subtracts voltage from the total value obtained in the synthesis and melting, FIG. 2(b).

(iii) Cooling. Upon completion of growth, the voltage is to be gradually reduced so as to consent a correct cooling of the crystal. Keeping the voltage value of channel CH2 constant, the cooling in various stages is programmed on channel CH3, which again begins to work, after the inactivity during the entire growth time (FIG. 2(c)).

The following examples are given only as illustrative and non limiting examples of the present invention.

EXAMPLE 1

Synthesis of the GaAs polycrystal.

182 g. of Ga (purity 7N) Alusuisse, 202.2 g. of As (purity 6N) MCP with molar ratio Ga/As of 0.968 70 g. of JMC $B_2O_3$ Puratronic purified with the method hereinabove described and corresponding, at the molten state, to a thickness of 11 mm are loaded in a heralux quartz crucible (diameter=20 mm, height=70 cm). The Czochralski CZ oven is started up with the relevant voltage ramp programmer interfaced through a microprocessor with the CAT series 8 temperature regulator.

The CZ oven is of the type hereinbefore mentioned; the microprocessor used is described in (Italian patent application 20915A/85

The programmer has two channels CH2 and CH3 with output voltages $V_2$ and $V_3$, which vary between 1 and 5 V and with minimum increments of 10 mV.

The microprocessor mentioned in the previous patent application of the Applicants, has an output voltage $V_{out}$ in mV defined by the equation:

$$V_{out} = V_3 + V_2/10 - 500 \quad (3)$$

wherein 500 is a supplied voltage V, in mV, and the minimum increments of $V_{out}$ are 1 mV.

In Table 1, elementary stages (stage) up to stage 8, temperature, the positions of the growth station (including the crucible) in the various positions inside the radio-frequency coil with the relevant temperature gradient in the initial and final conditions of the synthesis (see FIGS. 1-1 and 1-2), the $N_2$ pressure, the times for every stage, relative to the synthesis of the polycrystal, are shown.

In table 2A, the programme of the Honeywell voltage ramp programmer hereinbefore mentioned for the synthesis of the polycrystal with the indication of the channel used, of the stage corresponding to the various used voltages in mV, the permanence duration at a fixed value of the set point stoppage, and the time spent for passing from one set point to another (ramp) which determines the voltage variation in the time unit, are shown.

In the column "Notes" of Table 1 and 2A, it is possible to correlate the variations of temperature inside the growth chamber with the variations of voltage applied in the time unit.

At the end of the synthesis, the polycrystal can be cooled according to the cooling cycle described for the single crystal hereinafter, stages 14-15 of table 2A and 21-22 of table 2B.

Generally, the qualities of the polycrystal can be checked on the basis of the characteristics of the single crystal grown by using the thus prepared polycrystal, as precursor.

Synthesis of the GaAs single crystal

The hereinbefore obtained polycrystal is melted and used for the growth of the single crystal, using the stages shown in the tables 1, 2A, and in detail, in the table 2B. Practically, the operations generally indicated in the text of the present invention, are carried out with the values of the various variables shown in the cited tables.

The pulling conditions were the following:
Pulling speed: 1.5 cm/hour,
Shaft rotation speed: 6 rpm anti-clockwise.
Crucible rotation speed: 4 rpm clockwise
A seed having the orientation <111> was used, with nitrogen pressure of 3 atm in the growth chamber.

The undoped single crystal obtained is semi-insulating n-type and weighs 380 g.

The characteristics of the single crystal are the following:
(EDP) dislocations about $10^3$ cm$^{-2}$ both axially and radially;
$\rho = 10^6 - 10^7 \Omega$cm
$\mu = 2000-3500$ cm$^2$/(Volt.sec.);
Impurities $< 5 \times 10^{15}$ atoms/cm$^3$;
Diameter = $40 \pm 2$ mm

EXAMPLE 2

Polycrystal synthesis and subsequent growth of the 1 Kg. single.

500 g of Ga (purity 7N) Alusuisse, 548 g of As (purity 6N) MCP with Ga/As molar ratio of 0.98 are loaded with $B_2O_3$ (100 g) Puratronic JMC purified as hereinbefore said, in a heralux quartz crucible (diameter=80 mm and height=80 mm). A <111> seed is used. The synthesis process of the polycrystal is the same as in example 1 and the program for the growth of the single crystal is that shown in table 2C. 3 atm of ultrapure $N_2$ pressure are used. Growth operating conditions are the same as in example 1. An undoped n-type <111> single crystal with characteristics similar to those of the single crystal in Example 1, 4, 5 cm $\pm$ 2 mm in diameter and 1 Kg in weight, is obtained.

EXAMPLE 3

Synthesis of a polycrystal and subsequent growth of a single crystal 2.8 cm in diameter. 150 g of Ga (purity 7N) Alusuisse, 164 g of As (purity 6N) with molar ratio Ga/As of 0.98 $B_2O_3$ (70 g) Puratronic JMC purified as said in the text, are loaded. A <111> seed is used. The synthesis and the growth are carried out as in example 1 with the use of the growth program shown in table 2D to obtain a highly perfect n-type <111> crystal 2.8 cm $\pm$ 2 mm in diameter having a weight of 300 g.

The characteristics of the crystal are similar to those of Example 1, EDP is comprised between $10^2-10^3$ cm$^{-2}$.

EXAMPLE 4

Silicon doped <111> single crystal

Example 1 is repeated, with the sole difference that 0.2 mg of silicon for every gram of GaAs polycrystal is used as dopant. Practically the silicon is also added, while loading Ga and As A <111> seed is used, operating during the synthesis and growth as in example 1. An n-type <111> doped crystal 380 g in weight with the following characteristics is obtained:
EDP = $0-10^2$ cm$^{-2}$
$\rho = 10^{-3}$ $\Omega$cm
$\mu = 1200$ cm$^2$/(Volt.sec.)
N = $5 \times 10^{18}$ atoms/cm$^3$, where
N is the number of carriers

EXAMPLE 5

Undoped <100> single crystal

Ga, As and $B_2O_3$ are loaded as in example 3 and working conditions are as in Example 1. A <100> seed is used and synthesis and growth are the same as in example 1 using the program of example 1. An n-type <100> undoped crystal, weighing 300 g with the following characteristics is obtained:
EDP=$10^3$-$5\times10^3$ cm$^{-2}$
e=$10^4$-$10^5$ Ωcm
$\mu$=1000-1500 cm$^2$/Volt.sec.;
diameter=4.5 cm ±2 mm
impurities<$5\times10^{15}$ atoms/cm$^3$

EXAMPLE 6

Growth of an n-type <111> single crystal at 30 atm. of N$_2$ pressure

Ga, As and B$_2$O$_3$ are loaded in the same quantities and in the same manner as in example 1, a <111> seed is used operating at 30 atm during the growth instead of at 3 atm with ultrapure N$_2$. For the synthesis and growth, operations are as in example 1, but using the growth program shown in table 2E.

An n-type undoped<111>crystal 380 g in weight and 5 cm±2 mm in diameter with electric and structural characteristics similar to those of Example 1, is obtained.

EXAMPLE 7 COMPARISON

Example 6 is repeated, but using 300 g of a commercial polycrystal produced by M.C.P. Electronics Limited; 70 g of B$_2$O$_3$ and a <111> orientated seed, are used. The program shown in table 2E is used in the growth phase. A single crystal 45±2 mm in diameter, 295 g in weight, with the following characteristics, is obtained:
EDP=$1$-$5\times10^4$ cm$^{-2}$;
$\rho$=2.2 Ωcm;
$\mu$=3430 cm$^2$/(Volt.sec).

From a comparison of the obtained results with those of Example 6, it is observed that the dislocations are higher by a 10 factor, and the resistivity is lower, since the polycrystal was obtained by the Bridgam method and therefore doped with silicon, and so a semiinsulating single crystal, as in the present invention (Example 6) is not obtained.

TABLE 1

| | STAGES FOR THE SYNTHESIS AND THE GROWTH OF GaAs IN CZ OVEN | | | | |
|---|---|---|---|---|---|
| Stage | Temperature (1) °C. | Gradient (2) | N$_2$ Pressure (atm) | Time (min.) | NOTES |
| 0 | 20 | 1 | $10^{-5}$ (Torr) | 600 | Vacuum treatment of the charge |
| 1 | 20–600 | 1 | 5 | 20 | B$_2$O$_3$ Melting |
| 2 | 600 | 1 | 60 | 15 | Charge covering with B$_2$O$_3$ |
| 3 | 600 | 2 | 60 | 5 | Change of temperature gradient |
| 4 | 600–820 | 2 | 60 | 15 | |
| 5 | 820 | 2 | 60 | 15 | Reaction |
| 6 | 820–1250 | 2 | 60 | 20 | |
| 7 | 1250 | 2 | 60 | 20 | GaAs melting |
| 8 | 1000 | 2 | 60 | 10 | Condensation |
| 9 | 1250 | 2 | 60 | 10 | GaAs melting |
| 10 | 1238 | 2 | 3 | 30 | Temperature stabilization |
| 11 | 1238 | 2 | 3 | 300 | Growth of the crystal |
| 12 | 1238–30 | 2 | 3 | 600 | Cooling |

(1) Values measured inside the crucible
(2) See FIG. 1

TABLE 2

| STAGES of the Honeywell DCP 7700 programmer for the synthesis and the growth of the GaAs in CZ oven of the channel 3 (CH3) | | | | | |
|---|---|---|---|---|---|
| Programmer channel | Stage (N°) | Set point (m') | Fixed value (time in minutes) | RAMP (time in minutes) | NOTES |
| 3 | 1 | 229 | 0 | | Oven start-up (Nitrogen 10 atm). crucible in gradient type 1. FIG. 1 |
| | 2 | | | 20 | |
| | 3 | 287 | 20 | | B$_2$O$_3$ Melting |
| | 4 | | | 15 | nitrogen input (60 atm) |
| | 5 | 305 | 15 | | Crucible gradient type 2 FIG. 1 |
| | 6 | | | 20 | |
| | 7 | 330 | 15 | | Reaction |
| | 8 | | | 20 | |
| | 9 | 420 | 10 | | GaAs melting |
| | 10 | 350 | 10 | | Condensation |
| | 11 | 420 | 10 | | GaAs melting |
| | 12 | 360 | 5 | | Nitrogen pressure 3 atm |
| | 13 | 360 | 590 | | Crystal growth |
| | 14 | | | 240 | Cooling |
| | 15 | 300 | 0 | | |

TABLE 2

| STAGES of the Honeywell DCP 7700 programmer for the synthesis and the growth of the GaAs single crystal in CZ oven of channel 2 (CH2) | | | | | |
|---|---|---|---|---|---|
| Programmer channel | Stage (N°) | Set point (m') | Fixed value (time in minutes) | RAMP minutes) | NOTES |
| 2 | 1 | 500 | 155 | | Synthesis |
| | 2 | 500 | 5 | | Stabilization of the |

TABLE 2-continued

STAGES of the Honeywell DCP 7700 programmer for the synthesis and the growth of the GaAs single crystal in CZ oven of channel 2 (CH2)

| Programmer channel | Stage (N°) | Set point (m$^{v}$) | Fixed value (time in minutes) | RAMP (time in minutes) | NOTES |
|---|---|---|---|---|---|
| | 3 | 500 | 10 | | temperature in the melt Formation of the neck |
| | 4 | | | 35 | |
| | 5 | 480 | 10 | | |
| | 6 | | | 10 | Formation of the shoulder |
| | 7 | 474 | 0 | | |
| | 8 | | | 10 | |
| | 9 | 467 | 0 | | |
| | 10 | | | 15 | |
| | 11 | 455 | 0 | | |
| | 12 | | | 55 | |
| | 13 | 405 | 0 | | Start of cylinder formation |
| | 14 | | | 40 | |
| | 15 | 365 | 0 | | |
| | 16 | | | 15 | |
| | 17 | 353 | 0 | | |
| | 18 | | | 20 | |
| | 19 | 341 | 0 | | |
| | 20 | | | 120 | |
| | 21 | 281 | 840 | | Cooling |
| | | 229 | 0 | | |

TABLE 2C

STAGES of the Honeywell DCP 7700 programmer for the synthesis and the growth of the GaAs single crystal in CZ oven of channel 2 (CH2)

| Programmer channel | Stage (N°) | Set point (m$^{v}$) | Fixed value (time in minutes) | RAMP (time in minutes) | Set Point/Ramp (mV/min.) | NOTES |
|---|---|---|---|---|---|---|
| 2 | 1 | 500 | 76 | | | Melting |
| | 2 | 500 | 5 | | | Neck |
| | 3 | 500 | 10 | | | " |
| | 4 | | | 35 | 0.57 | " |
| | 5 | 480 | 10 | | | " |
| | 6 | | | 10 | 0.6 | Cone (shoulder) |
| | 7 | 474 | 0 | | | " |
| | 8 | | | 10 | 0.7 | " |
| | 9 | 467 | 0 | | | " |
| | 10 | | | 15 | 0.8 | " |
| | 11 | 455 | 0 | | | " |
| | 12 | | | 55 | 0.9 | " |
| | 13 | 405 | 0 | | | Cylinder |
| | 14 | | | 60 | 1.0 | " |
| | 15 | 345 | 0 | | | " |
| | 16 | | | 25 | 0.8 | " |
| | 17 | 325 | 0 | | | " |
| | 18 | | | 40 | 0.6 | " |
| | 19 | 301 | 0 | | | " |
| | 20 | | | 120 | 0.5 | " |
| | 21 | 245 | 0 | | | " |
| | 22 | 241 | 840 | | | Cooling |
| | 23 | 229 | 0 | | | " |

TABLE 2D

STAGES of the Honeywell DCP 7700 programmer for the synthesis and the growth of the GaAs single crystal in CZ oven of channel 2 (CH2)

| Programmer channel | Stage (N°) | Set point (m$^{v}$) | Fixed value (time in minutes) | RAMP (time in minutes) | Set Point/Ramp (mV/min.) | NOTES |
|---|---|---|---|---|---|---|
| 2 | 1 | 500 | 76 | | | Melting |
| | 2 | 500 | 5 | | | Neck |
| | 3 | 500 | 10 | | | " |
| | 4 | | | 35 | 0.57 | " |
| | 5 | 480 | 10 | | | " |
| | 6 | | | 10 | | Cone (shoulder) |
| | 7 | 477 | 0 | | | " |
| | 8 | | | 10 | 0.35 | " |
| | 9 | 473 | 0 | | | " |
| | 10 | | | 15 | 0.4 | " |
| | 11 | 467 | 0 | | | " |
| | 12 | | | 55 | 0.45 | " |
| | 13 | 442 | 0 | | | Cylinder |

TABLE 2D-continued

STAGES of the Honeywell DCP 7700 programmer for the synthesis and the growth of the GaAs single crystal in CZ oven of channel 2 (CH2)

| Programmer channel | Stage (N°) | Set point (m') | Fixed value (time in minutes) | RAMP (time in minutes) | Set Point/Ramp (mV/min.) | NOTES |
|---|---|---|---|---|---|---|
| | 14 | | | 90 | 0.5 | " |
| | 15 | 397 | 0 | | | " |
| | 16 | | | 20 | 0.4 | " |
| | 17 | 389 | 0 | | | " |
| | 18 | | | 20 | 0.3 | " |
| | 19 | 383 | 0 | | | " |
| | 20 | | | 200 | 0.5 | " |
| | 21 | 333 | 840 | | | Cooling |
| | 22 | 229 | 0 | | | " |

TABLE 2E

STAGES of the Honeywell DCP 7700 programmer for the synthesis and the growth of the GaAs single crystal in CZ oven of channel 2 (CH2)

| Programmer channel | Stage (N°) | Set point (m') | Fixed value (time in minutes) | RAMP (time in minutes) | Set Point/Ramp (mV/min.) | NOTES |
|---|---|---|---|---|---|---|
| 2 | 1 | 500 | 76 | | | Melting |
| | 2 | 500 | 5 | | | " |
| | 3 | 500 | 10 | | | Neck |
| | 4 | | | 35 | 0.57 | " |
| | 5 | 480 | 10 | | | " |
| | 6 | | | 10 | 0.6 | Cone (shoulder) |
| | 7 | 474 | 0 | | | " |
| | 8 | | | 10 | 0.7 | " |
| | 9 | 467 | 0 | | | " |
| | 10 | | | 15 | 0.8 | " |
| | 11 | 455 | 0 | | | " |
| | 12 | | | 55 | 0.9 | " |
| | 13 | 405 | 0 | | | " |
| | 14 | | | 10 | 0.8 | Cylinder |
| | 15 | 397 | 0 | | | " |
| | 16 | | | 120 | 0.7 | " |
| | 17 | 313 | 840 | | | Cooling |
| | 18 | 229 | 0 | 20 | 0.3 | " |

We claim:

1. Gallium Arsenide single crystals having a diameter in the range 1 to 2 inches, a weight in the range of 200 g to 1 kg, an impurity content less than or equal to $5 \times 10^{15}$ atoms/cm$^3$, wherein the EDP dislocation density, both axial and radial, is between $5 \times 10^2$ and $8 \times 10^3$ cm$^{-2}$, with a diameter constancy of $\pm 2$ mm, having a circular section, cylindrical shape, and any orientation.

2. GaAs single crystals, according to claim 1, oriented according to the directions $<111>$ or $<100>$.

3. GaAs single crystals according to claim 2, having the orientation $<111>$ with a dislocation density in the range of $5 \times 10^2$ to $10^3$ cm$^{-2}$.

4. GaAs single crystals according to claim 2, having the orientation $<100>$ with a dislocation density in the range of $10^3$ to $8 \times 10^3$ cm$^{-2}$.

5. Gallium Arsenide single crystals having a diameter in the range 1 to 2 inches, a weight in the range of 200 g to 1 kg, doped with $10^{17}$–$10^{18}$ atoms/cm$^3$ of dopant without any microprecipitates, wherein the EDP dislocation density, both axial and radial, is between 0 and $10^2$ cm$^{-2}$, with a diameter constancy of $\pm 2$ mm, having a circular section, cylindrical shape, and any orientation.

6. GaAs single crystals according to claim 5, wherein the dopant is selected from the group consisting of silicon, sulphur, tellurium, selenium, boron, chrome and zinc.

7. Process for the preparation of GaAs single crystals having a diameter in the range 1 to 2 inches, a weight in the range of 200 g to 1 kg, an impurity content less than or equal to $5 \times 10^{15}$ atoms/cm$^3$ wherein the EDP dislocation density, both axial and radial, is between $5 \times 10^2$ and $8 \times 10^3$ cm$^{-2}$, with a diameter constancy of $+2$ mm, having a circular section cylindrical shape, and any orientation, with the LEC technique in a single cycle, the process comprising the following phases:

(a) preparation of the GaAs polycrystal in situ which comprises the reaction of the elements Ga and As, in inert gas high pressure conditions, in the range of 50 to 70 atm, operating in the presence of a quantity of B$_2$O$_3$ such as to give a layer of melt in the range of 0.7 to 2 cm thick, using a commercial voltage ramp programmer on a voltage output channel having minimum voltage increments of about 10 mV, said voltage being increased during this phase in such a way as to limit the As evaporation at values $\leq 1\%$ by weight with respect to the initial quantity as As used, during the entire phase so that the stoichiometry of the polycrystal is comprised between the following values:

$$0.49 < As/(Ga+As) < 0.51;$$

(b) growth of the single crystal using the polycrystal obtained in (a) which comprises the melting of the polycrystal at temperatures in the range of 1250° C. to 1300° C., using inert gas pressures in the range of 60 to 70 atm in the growth chamber; lowering the temperature until the contact between seed and melt is formed; growth phase at low inert gas pressures comprised between 2 and 6 atm, or at high pressures in the range of 25 to 50 atm, for obtaining a neck in the range of 2 to 3 mm in diameter and in the range of 5 to 14 mm long, formation of the shoulder in the range of 1 to 2 hours, formation of the circular section cylindrical shape single crystal with a constant diameter in a time in the range of 3 to 5 hours; said phase (b) being carried out with a very strict temperature control automatically obtained by means of the use of microprocessor inserted between the oven and the programmer, which permits to obtain output voltages from channel 2 of said programmer with increments of $\leq 1$ mV.

(c) cooling of the single crystal comprising a slow and controlled decreasing stage at 30°–60° C./hour until the temperature in the range of 900° to 1000° C. is reached and a faster cooling stage, until room temperature is reached at 80°–120° C./hour.

8. Process according to claim 7, wherein the pulling speed of the seed in the growth phase of the single crystal varies between 0.5–2 cm/hour, the anti-clockwise shaft rotation speed in the range of 1 to 6 rpm, and the crucible rotation speed is in the range of 2 to 5 rpm.

9. GaAs polycrystals obtained according to claim 7, having stoichiometry included in the following range:

$$0.49 < As/(Ga+As) < 0.51;$$

and impurity $\leq 5 \times 10^{15}$ atoms/cm$^3$.

* * * * *